United States Patent
Yu

(10) Patent No.: US 7,713,861 B2
(45) Date of Patent: May 11, 2010

(54) METHOD OF FORMING METALLIC BUMP AND SEAL FOR SEMICONDUCTOR DEVICE

(76) Inventor: Wan-Ling Yu, 11-6F, No. 165, Sec. 5, Ming-Sheng E. Rd., Taipei (TW)

( * ) Notice: Subject to any disclaimer, the term of this patent is extended or adjusted under 35 U.S.C. 154(b) by 53 days.

(21) Appl. No.: 12/016,209

(22) Filed: Jan. 18, 2008

(65) Prior Publication Data

US 2009/0098724 A1    Apr. 16, 2009

Related U.S. Application Data

(63) Continuation-in-part of application No. 11/871,974, filed on Oct. 13, 2007.

(51) Int. Cl.
  *H01L 21/44* (2006.01)
(52) U.S. Cl. ........................ 438/614; 438/612; 438/613; 438/615; 438/616; 438/617; 257/673; 257/737; 257/772; 257/779; 257/E21.508; 257/E23.021; 257/E23.033
(58) Field of Classification Search ................. 438/614; 257/673, 737, 772, 779, E21.508, E23.021, 257/E23.033
See application file for complete search history.

(56) References Cited

U.S. PATENT DOCUMENTS

| | | | | |
|---|---|---|---|---|
| 5,249,728 | A * | 10/1993 | Lam | 228/111 |
| 5,877,078 | A * | 3/1999 | Yanagida | 438/612 |
| 6,063,207 | A * | 5/2000 | Yu et al. | 134/2 |
| 6,121,688 | A * | 9/2000 | Akagawa | 257/778 |
| 6,133,054 | A * | 10/2000 | Henson | 438/17 |
| 6,251,501 | B1 * | 6/2001 | Higdon et al. | 428/209 |
| 6,372,622 | B1 * | 4/2002 | Tan et al. | 438/612 |
| 6,413,851 | B1 * | 7/2002 | Chow et al. | 438/613 |
| 6,426,273 | B1 * | 7/2002 | Yanagida | 438/449 |
| 6,458,682 | B2 * | 10/2002 | Watanabe | 438/612 |
| 6,593,222 | B2 * | 7/2003 | Smoak | 438/615 |
| 6,635,393 | B2 * | 10/2003 | Pierrat | 430/5 |
| 6,815,324 | B2 * | 11/2004 | Huang et al. | 438/612 |
| 6,878,633 | B2 * | 4/2005 | Raskin et al. | 438/694 |
| 6,911,390 | B2 * | 6/2005 | Brintzinger | 438/637 |
| 6,930,032 | B2 * | 8/2005 | Sarihan et al. | 438/614 |
| 7,015,130 | B2 * | 3/2006 | Tsai et al. | 438/613 |
| 7,141,868 | B2 * | 11/2006 | Liao et al. | 257/667 |
| 7,183,192 | B2 * | 2/2007 | Park et al. | 438/614 |
| 7,189,646 | B2 * | 3/2007 | Huang | 438/671 |
| 7,205,243 | B2 * | 4/2007 | Vogt | 438/715 |
| 7,221,054 | B2 * | 5/2007 | Minda | 257/738 |
| 7,329,951 | B2 * | 2/2008 | Daubenspeck et al. | 257/737 |
| 7,348,210 | B2 * | 3/2008 | Daubenspeck et al. | 438/106 |
| 7,432,188 | B2 * | 10/2008 | Tsai et al. | 438/614 |

(Continued)

*Primary Examiner*—Fernando L Toledo
*Assistant Examiner*—Ankush K Singal

(57) ABSTRACT

The method mainly contains the following steps. First, an UBM is formed on a top side of a semiconductor's I/O pad. An isolative layer and a metallic foil are sequentially arranged in this order on the UBM. Then, a via is formed to expose the top surface of the UBM. Subsequently, a thin metallic layer is formed in the via and a resist is formed on the metallic foil. Then, by using the metallic foil and the thin metallic layer as an electrode to conduct electrical current, a metallic bump is formed using electroplating in the via on the top side of the UBM. Finally, the resist and the metallic foil are removed and the formation of the metallic bump is completed. Optionally coating on bump may be needed for certain chosen bump materials.

21 Claims, 3 Drawing Sheets

U.S. PATENT DOCUMENTS

| | | |
|---|---|---|
| 7,459,785 B2 * | 12/2008 | Daubenspeck et al. ...... 257/738 |
| 7,491,556 B2 * | 2/2009 | Jungnickel et al. ............ 438/15 |
| 7,553,751 B2 * | 6/2009 | Jeong et al. ................. 438/613 |
| 2003/0080422 A1 * | 5/2003 | Ohara ....................... 257/738 |
| 2003/0124833 A1 * | 7/2003 | Tong et al. ................. 438/613 |
| 2004/0110364 A1 * | 6/2004 | Tsai et al. .................. 438/597 |
| 2004/0115934 A1 * | 6/2004 | Broz et al. ................. 438/689 |
| 2004/0166661 A1 * | 8/2004 | Lei ........................... 438/614 |
| 2005/0014355 A1 * | 1/2005 | Chan et al. ................. 438/613 |
| 2005/0277245 A1 * | 12/2005 | Ohta et al. ................. 438/222 |
| 2006/0016861 A1 * | 1/2006 | Daubenspeck et al. . 228/180.21 |
| 2006/0043364 A1 * | 3/2006 | Jiang et al. ................... 257/48 |
| 2006/0252245 A1 * | 11/2006 | Ke et al. .................... 438/612 |
| 2006/0284288 A1 * | 12/2006 | Hu ............................ 257/668 |
| 2007/0075423 A1 * | 4/2007 | Ke et al. .................... 257/737 |
| 2007/0290343 A1 * | 12/2007 | Harada et al. .............. 257/737 |
| 2008/0067072 A1 * | 3/2008 | Kim et al. .................... 205/96 |

* cited by examiner

METHOD OF FORMING METALLIC BUMP AND SEAL FOR SEMICONDUCTOR DEVICE

CROSS-REFERENCES TO RELATED APPLICATIONS

This is a continuation-in-part of U.S. application Ser. No. 11/871,974, filed Oct. 13, 2007.

BACKGROUND OF THE INVENTION

1. Field of the Invention

The present invention generally relates to flip-chip packaging, and more particularly to a method of forming metallic bumps on the I/O pads and sealing up the active side of a semiconductor device.

2. The Prior Arts

Flip-chip packaging utilizes bumps to establish electrical contact between a chip's I/O pads and the substrate or lead frame of the package. Structurally, a bump actually contains the bump itself and a so-called under bump metallurgy (UBM) located between the bump and an I/O pad.

An UBM generally contains an adhesion layer, a barrier layer and a wetting layer, arranged in this order on the I/O pad. The bumps themselves, based on the material used, are classified as solder bumps, gold bumps, copper pillar bumps and bumps with mixed metals.

To form bumps on the UBMs, usually electroplating, printing, or stud bonding method is used. For electroplating, patterned resists are first formed on the UBMs and then metals are plated. For printing, solders are first printed on the UBMs and the solders are thermally cured into the bumps. For stud bonding, it is used for limited gold bumping only.

The semiconductor device with bumps will be soldered onto a substrate or lead frame. Then underfill is dispensed into space under the semiconductor device to seal up the active side of the semiconductor device and fix the semiconductor device to the substrate or lead frame firmly. Conventional flip-chip packaging process includes bumping, assembly, underfill dispensing and optional molding. Before underfill dispensing is completed, the bump only sits on UBM alone with a risky height/width ratio. Bump lift is the major failure in flip-chip packaging especially when bump count is high.

SUMMARY OF THE INVENTION

Accordingly, A method of forming metallic bumps on I/O pads is provided herein. A major objective of the present invention is to achieve enhanced bonding between the metallic bumps and the I/O pads and increase yield of bumping process. Another major objective is to seal up the active side of the semiconductor device in one single process. In other words, the present invention combines bumping and partial function of underfill dispensing in a single process so as to enhance the mechanical robustness of the bump. With present invention, underfill dispensing is not needed in flip-chip packaging for some semiconductor devices.

To achieve the foregoing objectives, the method mainly contains the following steps. First, an UBM is formed on a top side of a semiconductor device's I/O pad. An isolative layer and a metallic foil are sequentially arranged in this order on the UBM. Then, a via is formed to expose the top surface of the UBM. Subsequently, a thin metallic layer is formed in the via and a resist is formed on the metallic foil. Then, by using the metallic foil and the thin metallic layer in the via to conduct electrical current, a metallic bump is formed using electroplating in the via on the top side of the UBM. Finally, the resist and the metallic foil are removed and the formation of the metallic bump is completed.

The foregoing and other objects, features, aspects and advantages of the present invention will become better understood from a careful reading of a detailed description provided herein below with appropriate reference to the accompanying drawings.

DETAILED DESCRIPTION OF THE PREFERRED EMBODIMENT

The following descriptions are exemplary embodiments only, and are not intended to limit the scope, applicability or configuration of the invention in any way. Rather, the following description provides a convenient illustration for implementing exemplary embodiments of the invention. Various changes to the described embodiments may be made in the function and arrangement of the elements described without departing from the scope of the invention as set forth in the appended claims.

Figure 1A:
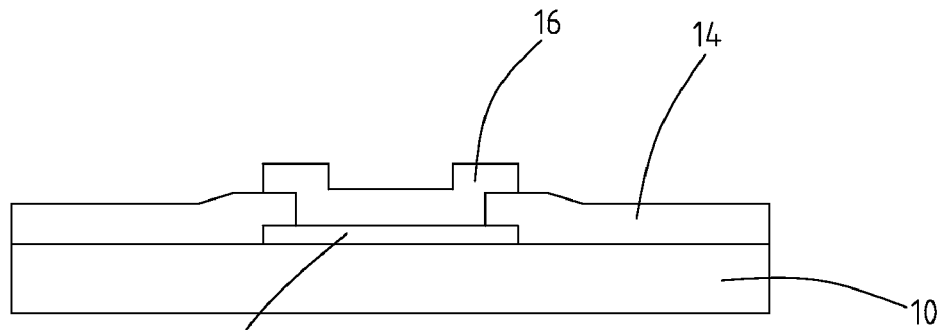
FIGS. 1A to 1H show the various steps of a method of forming a metallic bump on an I/O pad according to an embodiment of the present invention.

FIGS. 1A to 1H show the various steps of a method of forming a metallic bump on an I/O pad according to an embodiment of the present invention. As shown in FIG. 1A, an I/O pad 12 is located on a side of a semiconductor device 10 which can be an integrated circuit (IC), a transistor, a diode, or a thyristor. For ease of reference, this side is referred to as the active side of the semiconductor device 10. Also on the active side of the semiconductor device 10 is an optional passivation layer 14 which exposes part of a top surface of the I/O pad 12. Then, an UBM 16 is formed to entirely cover the exposed top surface of the I/O pad 12 and part of the passivation layer 14 that is also on the top surface of the I/O pad 12. The formation of the UBM 16 and the passivation layer 14 is conducted using any appropriate prior art technique. This should be well known to a skilled artisan in the related art and the details are therefore omitted here.

Figure 1B:
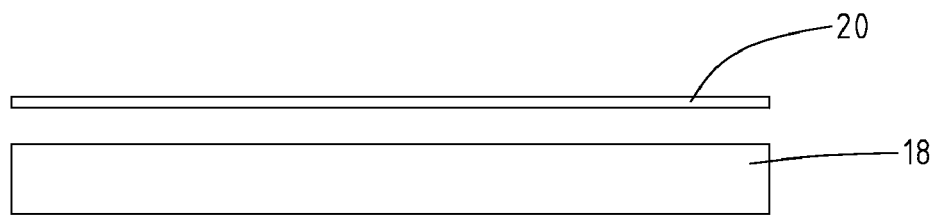
Figure 1B:
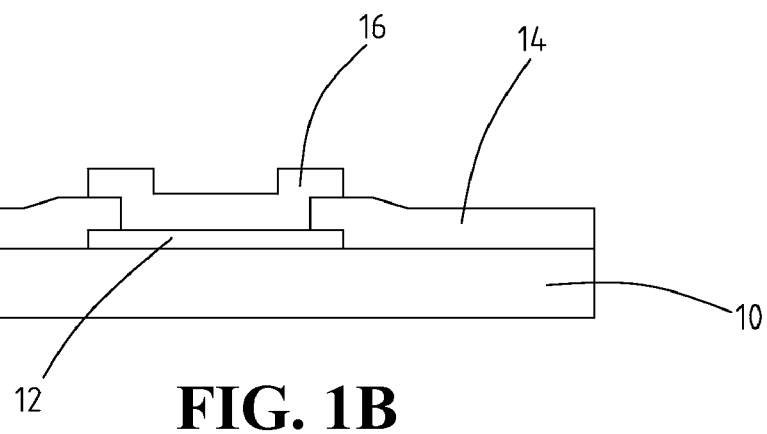
Figure 1C:
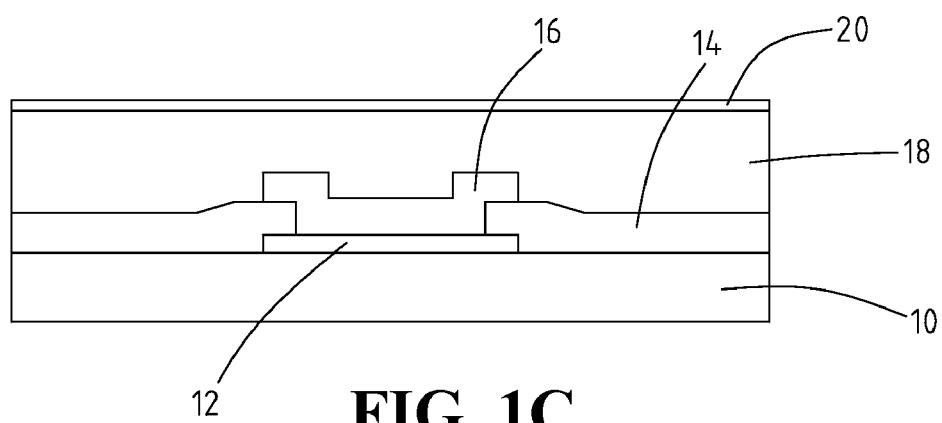

Then, according to the present embodiment, an isolative layer 18 and a metallic foil 20 are provided as shown in FIG. 1B. The isolative layer 18 and the metallic foil 20 are arranged sequentially in this order on a top side of the structure of FIG. 1A and the result is shown in FIG. 1C.

The material for the isolative layer 18 is one such that the isolative layer 18 is in a liquid state or in a temporarily solid state, so that the isolative layer 18 can reliably adhered to the structure of FIG. 1A. Various types of polymers such as epoxy resin are typical examples. Then, by applying appropriate heat and pressure to the isolative layer 18 in the liquid state or in the temporarily solid state, the isolative layer 18 is permanently solidified and thereby tightly joined to the structure of FIG. 1A. If an isolative material in temporarily solid state is chosen, the isolative material should be able to turn into liquid state again within a specific temperature range which is higher than its temporary solidification temperature but lower than its permanently solidification temperature. In one embodiment, the metallic foil 20 can be attached to a top side of the isolative layer 18 and, the combination is then attached to the top side of the structure of FIG. 1A. Subsequently, by applying appropriate heat and pressure to the isolative layer 18, it is permanently solidified, thereby tightly joined to the structure of FIG. 1A. In an alternative embodiment, the isolative layer 18 is in a temporarily solid state and is attached to the top side of the structure of FIG. 1A first. Subsequently, the metallic foil 20 is attached to the top side of the isolative layer 18. Then, by applying appropriate heat and pressure, the isolative layer 18 is permanently solidified, thereby tightly joined to the structure of FIG. 1A. The metallic foil 20 is made of copper, chromium, nickel, or other metallic material suitable for electroplating. The metallic foil 20 could be optionally thinned down if fine pitch bump or tiny bump is required.

Figure 1D:
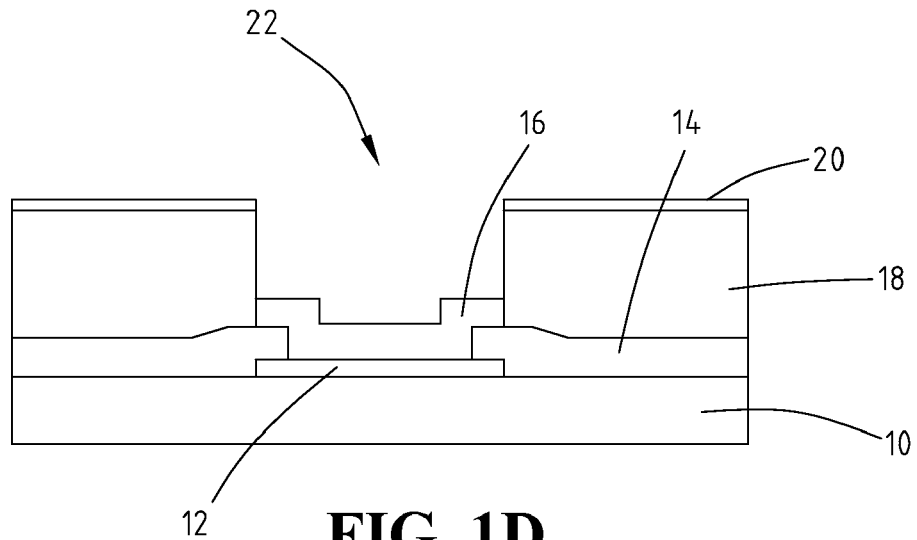

Then, a part of the metallic foil 20 above the UBM 16 is removed by laser ablation or chemical etching first and then the isolative layer 18 on a top side of the UBM 16 is removed by laser ablation or lithographic means. As such, a via 22 is formed and the UBM 16 is thereby exposed, as shown in FIG. 1D.

Figure 1E:
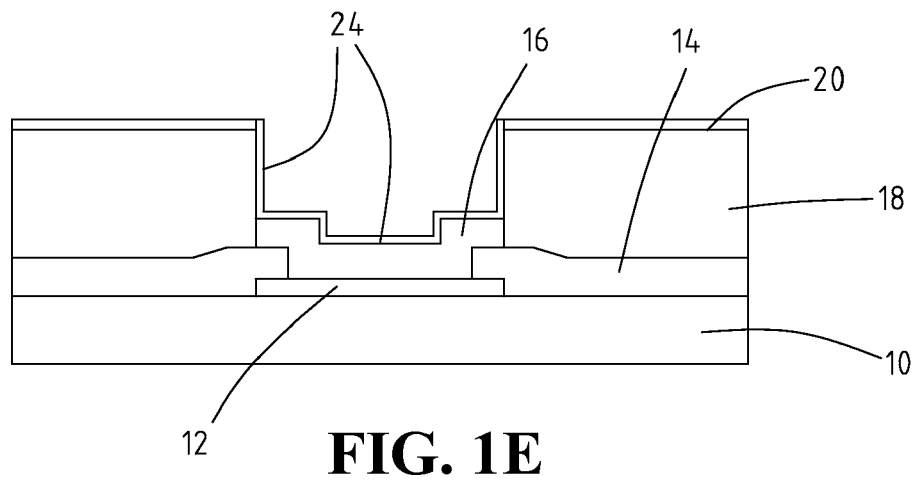
Figure 1F:
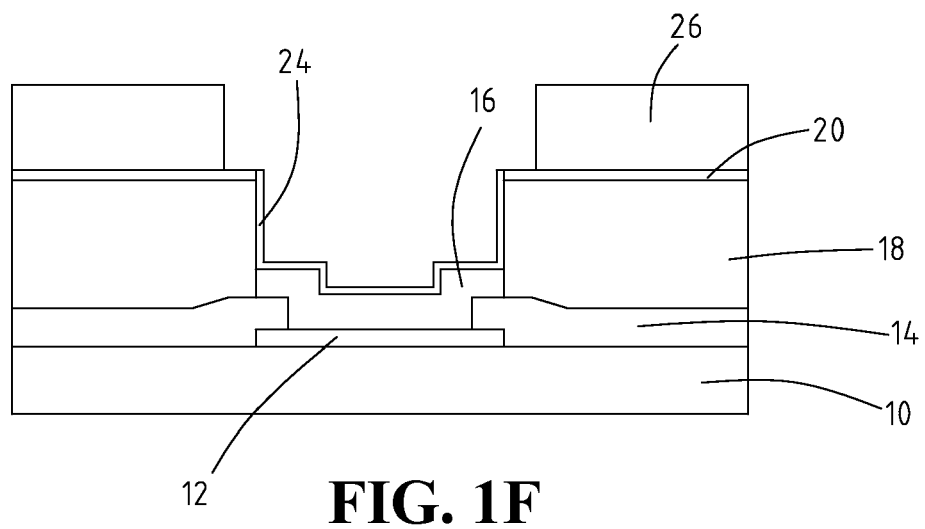
Figure 1G:
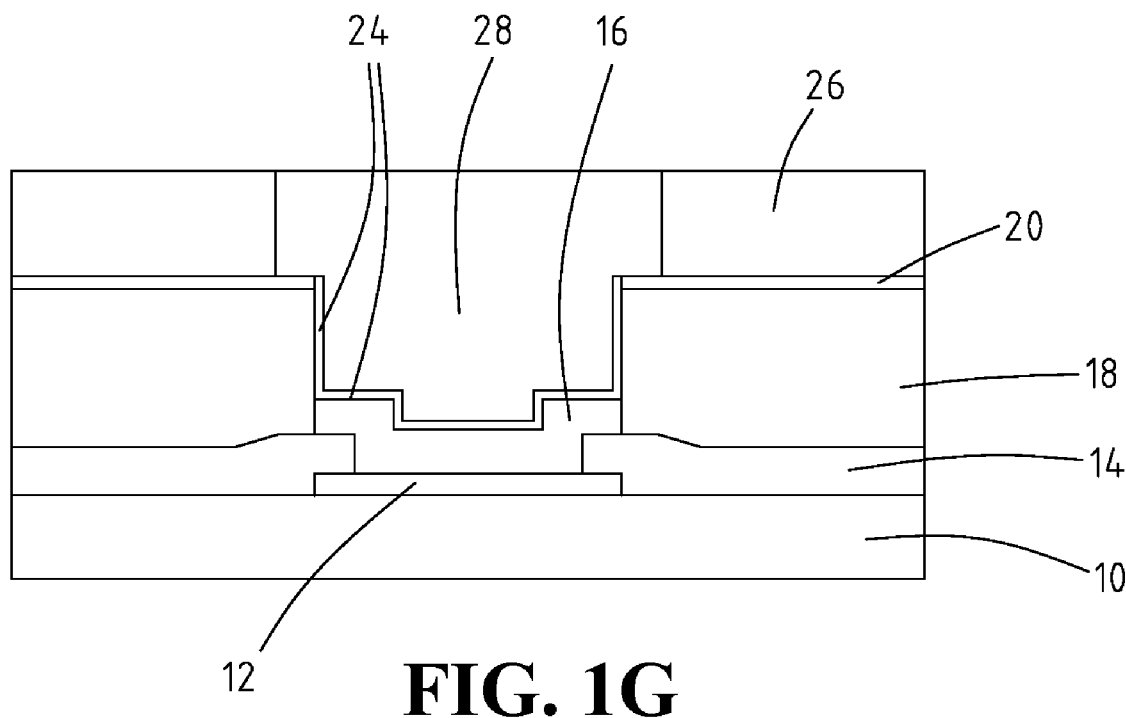
Figure 1H:
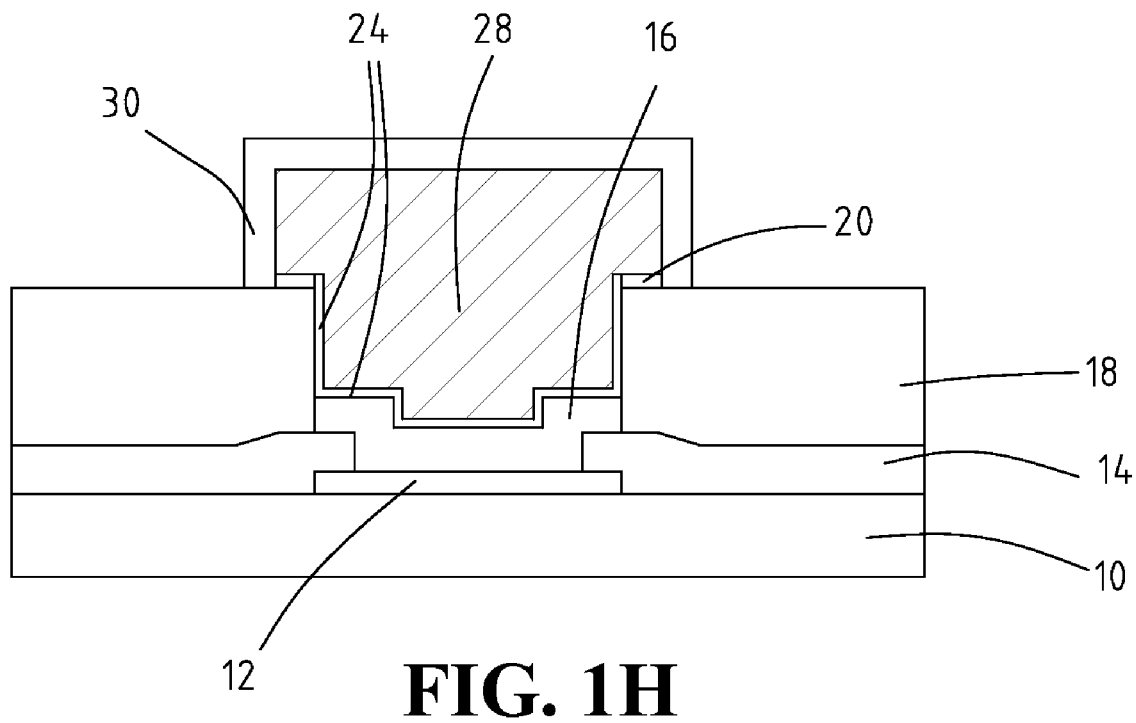

Subsequently, a thin metallic layer 24 is formed using electroless copper or nickel at least in the via 22 by electroless deposition or sputtering so that the thin metallic layer is connected to the metallic foil 20, as shown in FIG. 1E. For enhanced reliability, optionally, an additional metallic layer could be further formed by electroplating on an external surface of the thin metallic layer 24. Then, a resist 26 is formed on a top side of the metallic foil 20 with a plating opening (not numbered) to expose the via 22 coated with the thin metallic layer 24. As such, the metallic foil 20 and the thin metallic layer 24 can jointly function as an electrode to conduct electrical current to form a metallic bump 28 in the via 22 on the top side of the UBM 16 using electroplating, as shown in FIG. 1G. Finally, as shown in FIG. 1H, the resist 26 is removed and, by using laser or chemical etching, the metallic foil 20 is removed from both sides of the metallic bump 28 while a portion of the metallic foil 20 remains under the metallic bump 28. Then, the bump 28 can be further and optionally plated with a coating layer 30 at least on a top side of the bump 28 so as to prevent the bump 28 from oxidation before assembly. Depending on the material of the bump 28, various materials could be used as the coating layer 30. For example, for nickel bump 28, a coating layer 30 made of gold could be used and, for copper bump 28, the coating layer 30 could be made of OSP (Organic Solderability Preservative), electroless nickel immersion gold, immersion silver, immersion tin, just to name a few. The formation of the metallic bump 28 is therefore completed. The height of the metallic bump 28 can be controlled by having the resist 26 to be of an appropriate height and the width of bump 28 is determined by adjusting the aperture of the plating opening of resist 26.

In an alternative embodiment where the isolative layer 18 in the liquid state is applied to the structure of FIG. 1A without the metallic foil 20, the isolative layer 18 can be solidified into the temporarily solid state first and the via 22 exposing the UBM 16 is formed using laser or lithographic means. Then, the metallic foil 20 is attached to the temporarily solidified isolative layer 18 and solidified permanently. Then, after part of metallic foil 20 above the via 22 is removed by chemical etching or laser ablation, the result is the same as what is shown in FIG. 1D. The same subsequent steps as described above can be conducted to form the metallic bump 28.

In yet another alternative embodiment where the metallic foil 20 is not used at all, the isolative layer 18 is applied to the structure of FIG. 1A and solidified permanently. Then, the via 22 exposing the UBM 16 is formed using laser ablation or lithographic means. The thin metallic layer 24 is subsequently formed on the top side of the isolative layer 18 and in the via 22 by sputtering or electroless deposition. The thin metallic layer 24 is then optionally thickened to achieve better conductivity by electroplating and the result would be similar to what is shown in FIG. 1E. The same subsequent steps as described above can be conducted to form the metallic bump 28.

In still another alternative embodiment where the isolative layer 18 is also applied to the structure of FIG. 1A without the metallic foil 20 and solidified permanently, the thin metallic layer 24 is formed on the top side of the isolative layer 18 by sputtering or electroless deposition. The via 22 exposing the UBM 16 is then formed using laser ablation or lithographic means. Subsequently, the thin metallic layer 24 is formed again to cover at least the via 22 by electroless deposition. The thin metallic layer 24 is optionally thickened to achieve better conductivity by electroplating and the result would be similar to what is shown in FIG. 1E. The same subsequent steps as described above can be conducted to form the metallic bump 28.

To form the via 22 so that it exposes the UBM 16 precisely, the location of the UBM 16 has to be determined first. To achieve that, fiducial marks can be prepared in advance on a bottom side of the semiconductor device 10. Then, by inspecting the positions of the fiducial marks and their positional relationship to the I/O pad 12, the exact location of the UBM 16 can be determined. An alternative approach is to utilize an X-ray apparatus that can "see" through the metallic foil 20 of FIG. 1C to directly determine the exact location of the UBM 16. Another alternative approach is, after removing part of the metallic foil 20, to use a camera to detect the fiducial marks on the semiconductor wafer and then calculate the position of the UBM 16.

The most significant features of the present invention are as follows. First an element selected from a large collection of highly conductive metallic materials such as gold, silver, palladium, copper, tin, solder, nickel, and etc. or any combination of these highly conductive metallic materials can be used to form the metallic bump 28 through electroless deposition and electroplating. Secondly, the metallic bump 28's bonding to the I/O pad 12 is not solely relied on the adhesion between the metallic bump 28 and the UBM 16. According to the present invention, the isolative layer 18 provides additional adhesion, thereby achieving a superior bonding between the metallic bump 28 and the I/O pad 12. Thirdly, the isolative layer 18 actually seals up the active side of the semiconductor device. Underfill therefore could be omitted during subsequent assembly process. For certain applications, a semiconductor device with bumps thus formed could be used as a packaged component if bump pitch is wide enough for the applications.

Although the present invention has been described with reference to the preferred embodiments, it will be understood that the invention is not limited to the details described thereof. Various substitutions and modifications have been suggested in the foregoing description, and others will occur to those of ordinary skill in the art. Therefore, all such substitutions and modifications are intended to be embraced within the scope of the invention as defined in the appended claims.

What is claimed is:

1. A method of forming a metallic bump on an I/O pad on an active side of a semiconductor device for establishing electrical contact to said I/O pad, comprising the steps of:

forming an under bump metallurgy (UBM) on a top side of said I/O pad;

arranging an isolative layer and a metallic foil sequentially in this order on a top side of said UBM;

forming a via by removing a part of said isolative layer and said metallic foil so that a substantial part of said top side of said UBM is exposed;

forming a thin metallic layer at least in said via so that said thin metallic layer is connected to said metallic foil;
forming a resist on a top side of said metallic foil without covering said via coated with said thin metallic layer;
forming said metallic bump in said via on said top side of said UBM by using said metallic foil and said thin metallic layer jointly to conduct electrical current; and
removing said resist and said metallic foil from both sides of said metallic bump.

2. The method according to claim 1, wherein said semiconductor device is one of an integrated circuit, a transistor, a diode, and a thyristor.

3. The method according to claim 1, wherein said UBM comprises an adhesion layer, a barrier layer, and a wetting layer.

4. The method according to claim 1, wherein, when said isolative layer is arranged on said top side of said UBM, said isolative layer seals up said active side of said semiconductor device.

5. The method according to claim 1, wherein said metallic foil is made of one of copper, chromium, and nickel.

6. The method according to claim 1, further comprising the step of:
thinning down said metallic foil, if one of a fine-pitched metallic bump and a substantially small metallic bump is required.

7. The method according to claim 1, wherein said thin metallic layer is made of one of electroless copper and nickel.

8. The method according to claim 1, wherein said metallic bump is made of one of gold, silver, palladium, copper, tin, nickel, solder and a combination thereof.

9. The method according to claim 1, further comprising the step of:
forming an additional metallic layer on an external surface of said thin metallic layer before forming said resist.

10. The method according to claim 1, further comprising the step of:
forming a coating layer for anti-oxidation at least on a top side of said metallic bump.

11. The method according to claim 1, wherein said isolative layer is in one of a temporarily solid state and a liquid state; and, after said isolative layer and said metallic foil are arranged on said top side of said UBM, said isolative layer is permanently solidified.

12. The method according to claim 1, wherein said isolative layer is in a temporarily solid state and is arranged on said top side of said UBM first; said metallic foil is then arranged on a top side of said isolative layer; and said isolative layer is then permanently solidified.

13. The method according to claim 3, wherein said adhesion layer is made of one of aluminum and chromium; said barrier layer is made one of copper, lead, and platinum; and said wetting layer is made of gold.

14. A method of forming a metallic bump on an I/O pad on an active side of a semiconductor device for establishing electrical contact to said I/O pad, comprising the steps of:
forming an under bump metallurgy (UBM) on a top side of said I/O pad;
arranging an isolative layer in one of a liquid state and a temporarily solid state on a top side of said UBM and solidifying said isolative layer;
forming a via by removing a part of said isolative layer so that a substantial part of said top side of said UBM is exposed;
forming a thin metallic layer on a top side of said isolative layer and in said via;
forming a resist on a top side of said thin metallic layer without covering said via coated with said thin metallic layer;
forming said metallic bump in said via on said top side of said UBM by using said thin metallic layer to conduct electrical current; and
removing said resist and said thin metallic layer from both sides of said metallic bump.

15. The method according to claim 14, wherein said thin metallic layer is made of one of electroless copper and nickel.

16. The method according to claim 14, wherein said metallic bump is made of one of gold, silver, palladium, copper, tin, nickel, solder, and a combination thereof.

17. The method according to claim 14, further comprising the step of:
forming a coating layer for anti-oxidation at least on a top side of said metallic bump.

18. A method of forming a metallic bump on an I/O pad on an active side of a semiconductor device for establishing electrical contact to said I/O pad, comprising the steps of:
forming an under bump metallurgy (UBM) on a top side of said I/O pad;
arranging an isolative layer in one of a liquid state and a temporarily solid state on a top side of said UBM and solidifying said isolative layer;
forming a first thin metallic layer on a top side of said isolative layer;
forming a via by removing a part of said isolative layer and said first thin metallic layer so that a substantial part of said top side of said UBM is exposed;
forming a second thin metallic layer in said via so that said second thin metallic layer is connected to said first thin metallic layer;
forming a resist on a top side of said first thin metallic layer without covering said via coated with said second thin metallic layer;
forming said metallic bump in said via on said top side of said UBM by using said first and second thin metallic layers jointly to conduct electrical current; and
removing said resist and said first thin metallic layer from both sides of said metallic bump.

19. The method according to claim 18, wherein said first and second thin metallic layers are made of one of electroless copper and nickel.

20. The method according to claim 18, wherein said metallic bump is made of one of gold, silver, palladium, copper, tin, nickel, solder, and a combination thereof.

21. The method according to claim 18, further comprising the step of:
forming a coating layer for anti-oxidation at least on a top side of said metallic bump.

* * * * *